United States Patent
Liang et al.

(10) Patent No.: US 10,899,625 B2
(45) Date of Patent: Jan. 26, 2021

(54) PURIFYING DIAMOND POWDER

(71) Applicant: Halliburton Energy Services, Inc., Houston, TX (US)

(72) Inventors: Qi Liang, Richmond, VA (US); William Brian Atkins, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 37 days.

(21) Appl. No.: 15/738,145

(22) PCT Filed: Jul. 21, 2015

(86) PCT No.: PCT/US2015/041343
§ 371 (c)(1),
(2) Date: Dec. 20, 2017

(87) PCT Pub. No.: WO2017/014756
PCT Pub. Date: Jan. 26, 2017

(65) Prior Publication Data
US 2018/0179068 A1  Jun. 28, 2018

(51) Int. Cl.
| | | |
|---|---|---|
| C01B 32/28 | (2017.01) | |
| G01R 33/12 | (2006.01) | |
| C30B 29/04 | (2006.01) | |
| B01J 19/08 | (2006.01) | |
| B01J 19/12 | (2006.01) | |

(Continued)

(52) U.S. Cl.
CPC .............. *C01B 32/28* (2017.08); *B01J 19/088* (2013.01); *B01J 19/126* (2013.01); *C25F 1/00* (2013.01); *C25F 7/00* (2013.01); *C30B 29/04* (2013.01); *C30B 33/00* (2013.01); *G01R 33/12* (2013.01); *B01J 2219/0807* (2013.01); *B01J 2219/0871* (2013.01); *B01J 2219/0879* (2013.01); *B01J 2219/0894* (2013.01); *C01P 2002/72* (2013.01); *C01P 2004/02* (2013.01);
(Continued)

(58) Field of Classification Search
None
See application file for complete search history.

(56) References Cited

U.S. PATENT DOCUMENTS

| | | |
|---|---|---|
| 3,317,035 A | 5/1967 | Cannon |
| 4,184,079 A | 1/1980 | Hudson et al. |

(Continued)

FOREIGN PATENT DOCUMENTS

WO    2012/158380    11/2012

OTHER PUBLICATIONS

Arnault et al.; Surface Chemical Modification and Surface Reactivity of Nanodiamonds; Phys. Chem. Chem. Phys.; 13, pp. 11481-11487; 2011.*

(Continued)

*Primary Examiner* — Guinever S Gregorio
(74) *Attorney, Agent, or Firm* — Thomas Rooney; Baker Botts L.L.P.

(57) ABSTRACT

The present disclosure relates a method of purifying diamond by removing carbon contaminants from diamond grains in the diamond by a plasma cleaning process at a temperature at which metal inclusion contaminants in the diamond grains crack the diamond grains from within, and removing metal contaminants from the diamond in a chemical or electrochemical cleaning process.

19 Claims, 3 Drawing Sheets

(51) Int. Cl.
| | |
|---|---|
| *C30B 33/00* | (2006.01) |
| *C25F 1/00* | (2006.01) |
| *C25F 7/00* | (2006.01) |
| *G01N 21/87* | (2006.01) |
| *G01N 23/20* | (2018.01) |
| *G01N 21/84* | (2006.01) |

(52) U.S. Cl.
CPC .......... *C01P 2006/80* (2013.01); *G01N 21/87* (2013.01); *G01N 23/20* (2013.01); *G01N 2021/8477* (2013.01)

(56) References Cited

U.S. PATENT DOCUMENTS

| | | |
|---|---|---|
| 7,300,958 B2 | 11/2007 | Kataoka |
| 2005/0205847 A1 | 9/2005 | Dailly et al. |
| 2010/0028675 A1 | 2/2010 | Gogotsi et al. |
| 2013/0121909 A1 | 5/2013 | Petrev et al. |
| 2013/0330265 A1 | 12/2013 | Wang et al. |

OTHER PUBLICATIONS

Pichot et al.; An Efficient Purification Method for Detonation Nanodiamonds; Diamond & Related Materials; 17, 13-22; 2008.*

Chen et al.;Electrochemical Oxidation of Nitride on Nanodiamond Powder Electrode; Electrochimica Acta, 53, pp. 3442-3445; 2008.*

Suschchev et al.; Fundamentals of Chemical Purification of Detonation Nanodiamond Soot Using Nitric Acid; Journal of Superhard Materials, vol. 30, No. 5; pp. 297-304; 2008.*

Shenderova et al.; Production and Purification of Nanodiamonds Chapter 2; 2017.*

Yin, L-W., et al. "Formation and crystal structure of metallic inclusions in a HPHT as-grown diamond single crystal." Applied Physics A: Materials Science & Processing 71.4 (2000): 473-476; 5 pages.

Baumann, P. K., and R. J. Nemanich. "Surface cleaning, electronic states and electron affinity of diamond (100),(111) and (110) surfaces." Surface science 409.2 (1998): 320-335; 16 pages.

Buchkremer-Hermanns, H., C. Long, and H. Weiss. "ECR plasma polishing of CVD diamond films." Diamond and Related Materials 5.6-8 (1996): 845-849; 5 pages.

International Search Report and Written Opinion received for PCT Patent Application No. PCT/US2015/041343, dated Apr. 20, 2016; 8 pages.

Mucha, J. A., D. L. Flamm, and D. E. Ibbotson. "On the role of oxygen and hydrogen in diamond-forming discharges." Journal of Applied Physics 65.9 (1989): 3448-3452; 5 pages.

Anthony, B., et al. "In situ cleaning of silicon substrate surfaces by remote plasma-excited hydrogen." Journal of Vacuum Science & Technology B: Microelectronics Processing and Phenomena 7.4 (1989): 621-626; 6 pages.

Lee, C. L., et al. "Etching and micro-optics fabrication in diamond using chlorine-based inductively-coupled plasma." Diamond and Related Materials 17.7 (2008): 1292-1296; 5 pages.

* cited by examiner

PURIFYING DIAMOND POWDER

RELATED APPLICATIONS

This application is a U.S. National Stage Application of International Application No. PCT/US2015/041343 filed Jul. 21, 2015, which designates the United States, and is incorporated herein by reference in its entirety.

TECHNICAL FIELD

The present disclosure relates to purifying diamond powder.

BACKGROUND

The crystal structure of a material can vastly influence the resulting properties.

For example, diamond, graphite, and soot are each formed almost entirely from carbon (C) and differ only in their crystal structures. However, diamond is one of the hardest substances known and has a very high ability to conduct heat. Graphite and many other forms of carbon, in contrast, are very soft and do not conduct heat well and lack other useful properties of diamond. Diamond is frequently contaminated with these other carbon forms, which decrease the usefulness of the diamond for some applications.

Diamond may also be contaminated with metals or other materials that are less hard, less thermally conductive, or otherwise inferior for a given application. This is particularly true of synthetic diamond, which is often produced by a solvent-catalyst method from graphite dissolved in molten catalyst metal, such as nickel (Ni), cobalt (Co), or iron (Fe). The solvent-catalyst process often leaves behind excess graphite and precipitated catalyst metals and metal compounds as contaminants. The presence of these contaminants in diamond is detrimental for a wide variety of reasons. Although methods are available to remove diamond contaminants, such as acid baths, electrochemical leaching and flushing, these methods typically are limited to purifying the surface of a diamond grain only. Contaminants encapsulated within the diamond structure, sometimes referred to as inclusion materials, are common and are typically accessed by crushing the diamond grains. However, because diamond is the hardest known material, crushing processes are difficult and expensive to perform.

BRIEF DESCRIPTION OF THE DRAWINGS

A more complete and thorough understanding of the present embodiments and advantages thereof may be acquired by referring to the following description taken in conjunction with the accompanying drawings, which are not to scale, in which like reference numbers indicate like features, and wherein.

DETAILED DESCRIPTION

Contaminated diamond may be purified by first using a plasma cleaning treatment to remove carbon contaminants while concurrently causing expansion of metal inclusion contaminants, which cracks diamond grains from within, exposing the metal contaminants as well as any additional carbon contaminants co-located with the metal contaminants. Next a chemical or electrochemical treatment is used to remove exposed metal contaminants, resulting in purified diamond. The overall process not only increases diamond purity, it may also de-aggregate diamond grains and/or produce smaller diamond grain sizes, such as diamond grains with a nanometer grain size.

Figure 1A:
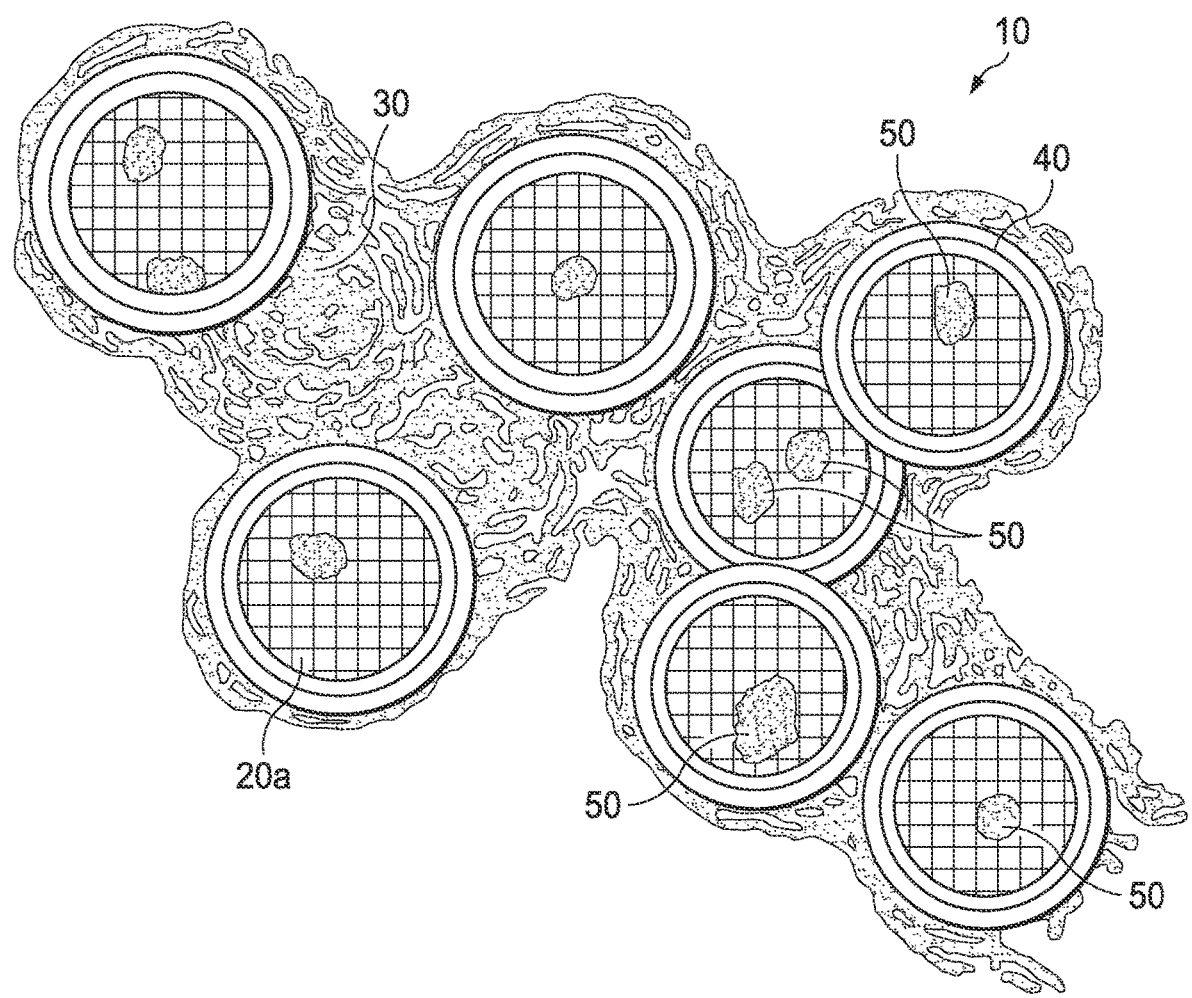
FIG. 1A is a schematic drawing in cross-section of unpurified diamond grains after formation by a solvent-catalyst method.
Figure 1B:
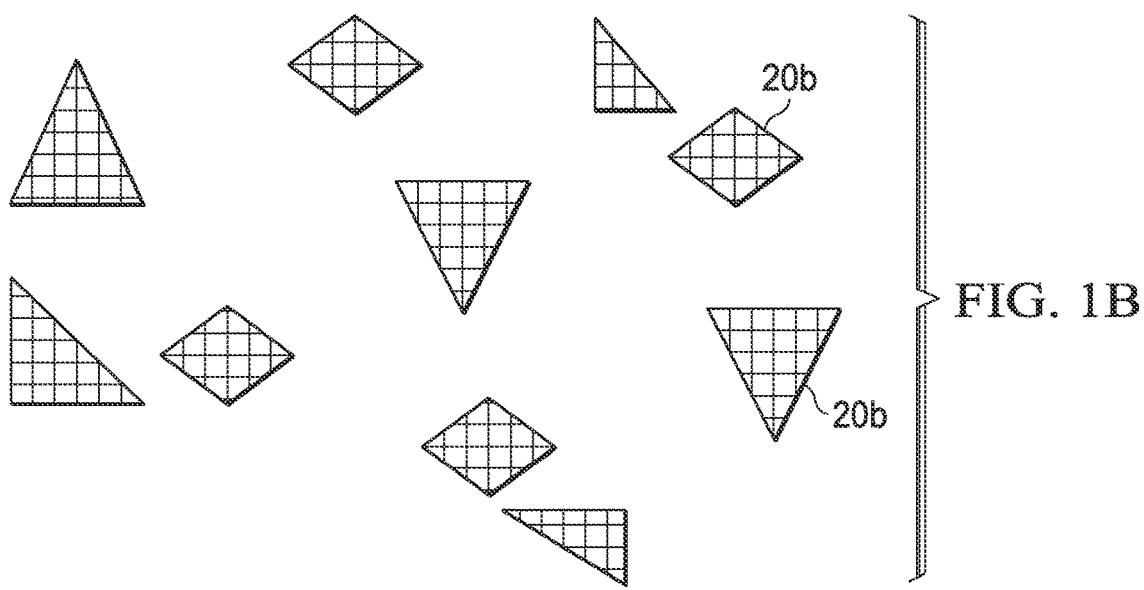
FIG. 1B is a schematic drawing in cross-section of diamond grains from FIG. 1A after purification using a method of the present disclosure.

FIG. 1A is a cross-section schematic drawing of an example unpurified diamond grain aggregate 10. The unpurified diamond grains 20a are located in a hydrocarbon matrix 30, which may be formed from soot and other hydrocarbons. Unpurified diamond grains 20a also contain onion-like shells 40 of carbon contaminants, such as graphitic material, as well as metal inclusion contaminants 50. Metal inclusion contaminants may include metals, such as Group VII metals, particularly Co, Ni, and Fe, metal alloys, and metal compounds, such as metal salts. FIG. 1B (also not to scale) is a cross-section schematic drawing of example purified diamond grains 20b. These diamond grains are smaller than unpurified diamond grains 20a and lack the hydrocarbon matrix 30 and the onion-like shells 40.

Figure 2:
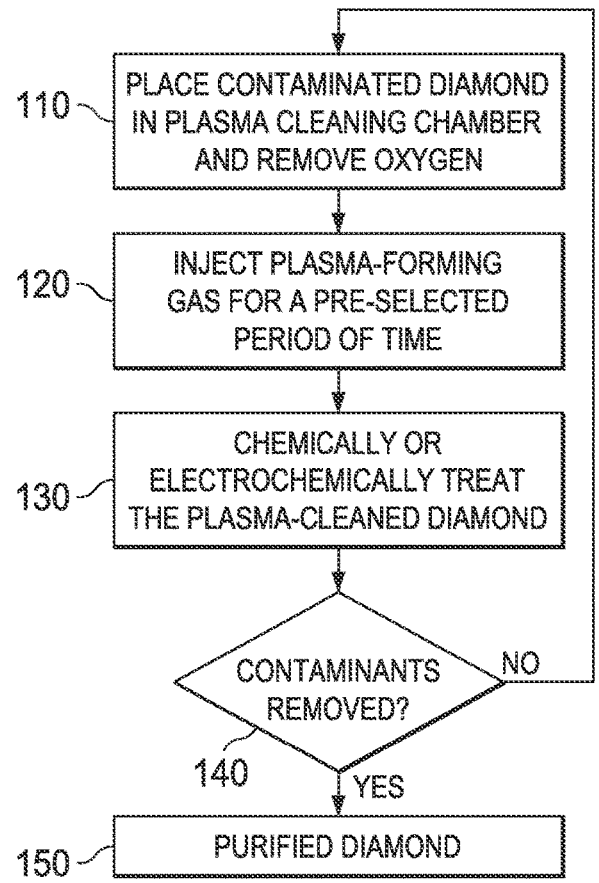
FIG. 2 is a flow chart of a process for purifying diamond.

Purified diamond, such as that depicted in FIG. 1B, may be produced from contaminated diamond, such as that depicted in FIG. 1A, using the purification process of FIG. 2. In step 110, contaminated diamond, which contains contaminated diamond grains, is placed in a plasma cleaning chamber. The plasma cleaning chamber typically contains an area for samples to be cleaned, such that the samples are exposed to plasma when it is created. Also in step 110, oxygen is removed from the plasma cleaning chamber. Typically, a vacuum is created in the plasma cleaning chamber by sealing it, then pumping out gas. Other methods of decreasing or minimizing the amount of oxygen present in the plasma cleaning chamber, such as pumping in other gasses, while allowing normal air to exit, may also be used. Oxygen, if present when plasma is created in the plasma cleaning chamber, may lead to additional contamination of the diamond. Thus, sufficient oxygen may be removed to keep oxygen-derived contaminants below a pre-determined level, such as the less than can be detected by XRD of a sample of the purified diamond.

After oxygen is removed from the plasma cleaning chamber, in step 120, a plasma-forming gas is injected into the chamber and ignited to form the plasma. This step also raises the temperature within the chamber, including the temperature of the contaminated diamond. Plasma-forming gasses suitable for step 120 include hydrogen (H), Argon (Ar), Oxygen (O), Fluorine (F), and any combinations thereof. Energy sources for igniting the plasma include microwaves, direct current electrodes, alternating current electrodes, radiofrequency electrodes, arc electrodes, and inductive coupling. Pressure in the plasma cleaning chamber may be between 10 milli Torr (for low pressure plasma cleaning) and 7600 Torr (for arc plasma cleaning) The plasma reacts with carbon contaminants on the surface of the diamond grains and removes them from the diamond. By products are carbon dioxide, carbon monoxide and hydrocarbon gasses which may be removed from the plasma cleaning chamber, or which may further react to form other gaseous materials that do not redeposit on the diamond.

The plasma may result a in diamond surface temperature of 300° C. to 1500° C., or 500° C. up to 1500° C. The internal temperatures may also be between 300° C. to 1500° C., or 500° C. up to 1500° C. At this temperature, metal inclusion contaminants expand much more than diamond as reflected in their coefficients of thermal expansion (CTEs). The expansion cracks the diamond grains from within. Table 1 lists CTEs for diamond and common metal inclusion contaminants. To the extent a different metal inclusion contaminant is used to crack the diamond grains, an appropriate plasma temperature to ensure cracking of a similar diamond crystal may be extrapolated from data developed using these common metal inclusion contaminants and, if applicable, other data such as concentration or other proportion data and data reflecting location of the inclusion contaminants within the diamond grains.

TABLE 1

CTEs of Diamond and Common Metal Inclusion Contaminants and 20° C.

| | Diamond | Cobalt | Nickel | Iron | Titanium | Molybdenum | Zirconium |
|---|---|---|---|---|---|---|---|
| CTE* | 1.18 | 12 | 13 | 12 | 8.6 | 5 | 5.7 |

*Expressed as $10^{-6}$ m/m K

Step 120 is carried out for a pre-selected period of time. Although the plasma may react with diamond as well, the rate at which it reacts with diamond is substantially lower than the rate at which it reacts with graphite, amorphous carbon, and other carbon contaminants. As a result, the pre-selected period of time may allow adequate removal of the carbon contaminants, while limiting the amount of diamond removed.

The period of time may have been pre-determined experimentally for diamond grains with similar types and amount of carbon contaminants and metal inclusion contaminants. This approach allows step 120 to be carried out for a minimal amount of time, which may be most efficient and cost-effective. Alternatively, the period of time may simply be a pre-selected period of time, such as 5 minutes, 10 minutes, 30 minutes, or 1 hour. Typically, either the experimentally determined period of time or simply pre-selected period of time will be sufficiently long to be expected to remove at least a pre-selected amount of carbon contaminants, to cause a pre-selected amount of cracking due to metal inclusion contaminants, to cause a pre-selected proportion of metal inclusion contaminants to be exposed through cracking, or to obtain a pre-selected grain size through cracking.

Step 120 optionally also includes physical agitation of the diamond grains. Physical agitation may be achieved through an agitator in the plasma cleaning chamber or by agitation of the entire chamber, or both. Physical agitation may cause the diamond grains to break apart more quickly after cracks are formed by metal inclusion contaminants. Physical agitation may also increase the amount of carbon contaminants removed, allow more rapid removal, or avoid patches of diamond grains or aggregated diamond from which the carbon contaminants have not been removed. Any of these effects may increase efficiency of the overall process and may allow a shorter pre-selected period of time than if no physical agitation were provided.

Step 120 may optionally be followed by a quenching step (not shown) in which the temperature of the diamond is rapidly decreased. Stresses placed on the diamond grains by material contraction during quenching may also cause them to crack. For instance, because diamond is very thermally conductive, it may cool much more rapidly during quenching than any inclusion contaminants, causing cracking around the contaminants.

Metal contaminants are typically not removed by plasma treatment because most metal contaminants do not have a gas phase. In step 130, the plasma-treated diamond, including plasma-treated diamond grains, are subjected to a chemical or electrochemical cleaning process to remove metal contaminants. The treatment may be selected based on metal contaminants expected or experimentally determined to be in the diamond. Often a single method of treatment will remove multiple types of metal contaminants, including, in many cases, all types of metal contaminants. Multiple types of treatments may be used concurrently or in sequence. Treatments to remove metal contaminants include chemical and electrochemical methods. Typically, the diamond is removed from the plasma cleaning chamber prior to chemical or electrochemical treatment.

Chemical treatments to remove metal contaminants may include exposing the diamond grains to a liquid able to dissolve a metal contaminant. Suitable liquids may be selected based on the metal contaminants to be removed, but will often include acids, such as aqua regia (one part nitric acid, three parts hydrochloric acid), other hydrochloric acids, other nitric acids, hydrofluoric acids, cupric chlorides, and ferric chlorides, and any combinations thereof. Suitable liquids may also include caustic materials, such as sodium and potassium hydroxides or a combination thereof. Whether the chemical treatment occurs in a bath or in a flush or wash, the length of time for which it is carried out, the temperature at which it is carried out, and whether pressure is applied depends on the liquid used, its concentration, the amount of metal contaminant to be removed, and how the diamond is provided. For instance, a bath of strong acid may be used with diamond that has been formed into PCD prior to chemical treatment, often at temperatures up to 800° C. or other elevated temperatures sufficient to allow metal or sintering aid removal. Loose diamond grains with a readily soluble metal contaminant, in contrast, may simply be washed.

Electrochemical treatments to remove metal contaminants may include using the diamond in an anode in an electrochemical cell also containing a cathode and an electrolyte. The anode and cathode may be electrically connected via leads and a voltage source, but otherwise are electrically insulated, else a short will occur. The anode and cathode are chemically connected via the electrolyte. The electrolyte may be in a liquid form and may be an acidic, aqueous salt solution, a non-aqueous ionic liquid, a liquid salt, and any combinations thereof. The electrolyte may include at least one ion, particularly an inorganic salt ion, such as a halide ion, a sulfate ion, a bicarbonate ion, a hypophosphate ion, and any combinations thereof. For instance, one example electrolyte may be formed from sulfuric acid an chloride ions.

In some treatment methods, positive ions formed from the metal contaminant may react with hydroxide ($OH^-$) present in the electrolyte to form a metal hydroxide that is not soluble in water and which may form deposits on the anode or cathode, requiring acid to remove them. This tendency to form deposits often hampers the electrochemical treatment and therefore, metal hydroxide formation may be decreased or avoided by providing another negative ion with which metal ions may react. Suitable alternative ions include sulfate ($SO_4^{2-}$), chloride ($Cl^-$), and nitrate ($NO_3^-$), and combinations thereof. The inclusion of an acid in the electrolyte further helps avoid deposits, even at pH or acid concentrations that are ineffective against interfering with metal hydroxide deposits. For example, the electrolyte may contain diluted nitric acid ($HNO_3$) and iron (III) nitrate ($Fe(NO_3)_3$).

If the diamond grains will ultimately be incorporated in an article, such as a polycrystalline diamond (PCD) table, the article may be formed from the diamond grains after the plasma cleaning treatment, and prior to any chemical or electrochemical treatment. This may allow additional contaminants, such as sintering aids used to form PCD, to be removed concurrently with the metal contaminants in step 130. In addition, to the extent the metal contaminants may act as sintering aids during PCD formation, waiting to perform step 130 until after the PCD has been formed may increase PCD formation efficiency or allow less additional sintering aid to be added to the diamond grains prior to or during PCD formation.

In step 140, the diamond is evaluated for residual contaminants. The method of evaluation may differ depending on whether the diamond is still in powder form, or whether it has been formed into an article, such as PCD.

If the diamond is determined, in step 140, to have less than a pre-selected amount of a pre-selected contaminant or set of contaminants, then it is deemed to be purified diamond in step 150. If the diamond has more then the pre-selected amount of a pre-selected contaminant or set of contaminants, it is returned to step 110 and undergoes further plasma cleaning treatment, followed by further chemical or electrochemical treatment. Alternatively, the diamond may be returned to only plasma cleaning treatment or only to chemical or electrochemical treatment, depending on the type and amount of residual contaminants found.

Magnetic sorting is one method suitable for evaluating the diamond in step 140. Many contaminants are paramagnetic, and thus are sensitive to forces applied by a magnetic field. A magnetic field may be used to separate contaminants or diamond containing contaminants from purified diamond.

Figure 3:
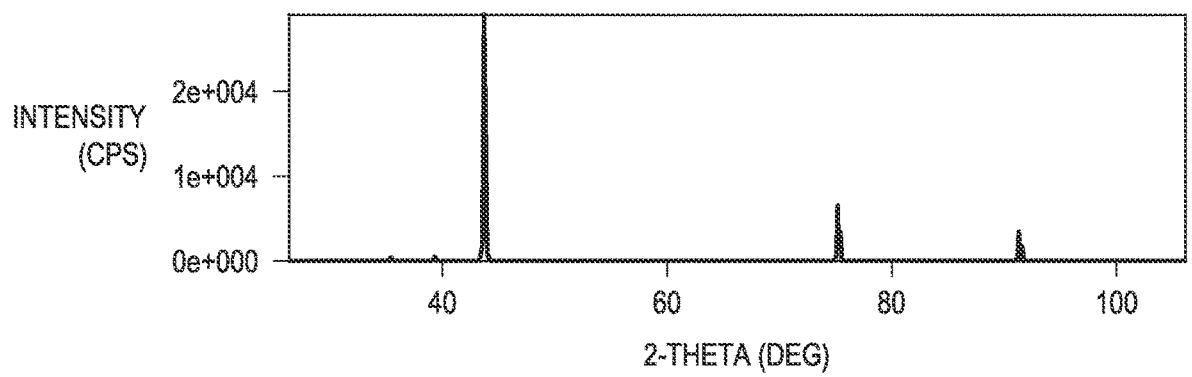
FIG. 3 is an example X-ray diffraction (XRD) profile of purified diamond.

XRD is one method suitable for evaluating the diamond in step 140. Peak patterns obtained using XRD may be matched to a known diamond pattern and patterns for known contaminants to identify residual contaminants. FIG. 3 is an example XRD pattern for purified diamond. Diamond fracture peaks at [11], [220] and [311] can be seen. Small peaks on the lower 2 theta axis represent very small amounts of residual contaminants. Residual contaminant peak intensity may be used to estimate the relative or total amount of a particular residual contaminant as well. Even when peaks cannot be matched to a specific residual contaminant, the presence of peaks that do not correspond with diamond may indicate the presence of unidentified residual contaminants, which may indicate a need to repeat the purification process. XRD may be used as the sole method of evaluation when crystalline residual contaminants are expected. However, because of limitations in detecting amorphous materials via XRD, if amorphous residual contaminants are expected or of particular concern, XRD may be combined with other methods better able to detect amorphous materials. Furthermore, because sample preparation for XRD is often destructive of a PCD article, if PCD is evaluated in step 140, a representative PCD article may be subjected to XRD testing and the results for that PCD article may be assumed to apply to other PCD articles formed from the same diamond in the same process batch of diamond grains and same batch of PCD manufacture.

Figure 4:
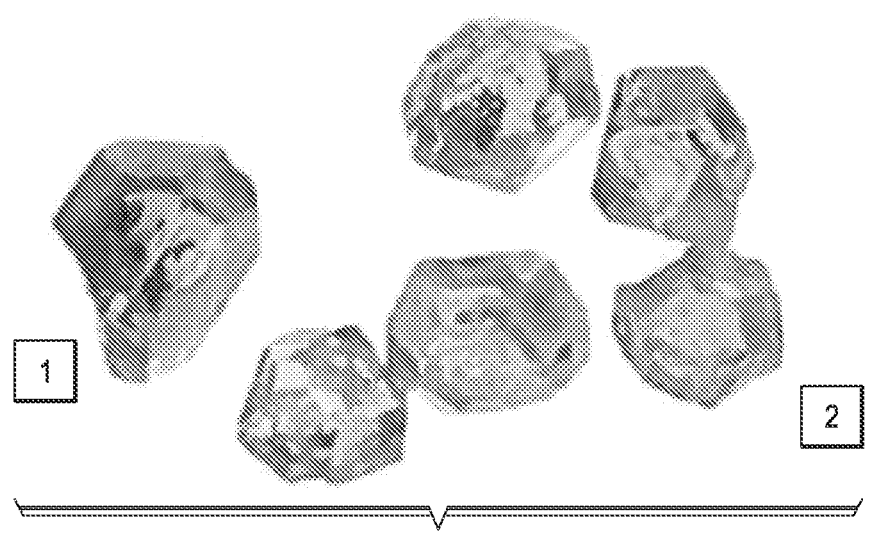
FIG. 4 is an example optical microscope image of contaminated (1) and purified (2) diamond.

Optical microscopy is another method suitable for use in step 140. Optical microscopy may be used to detect inclusion contaminants, such as those that can be seen in diamond grain (1) of FIG. 4. Such dark inclusion contaminants may not be visible in purified diamond grains, such as grains (2) in FIG. 4. The microscope magnification may be adjusted based on grain size and for very small grains that exceed the limits of optical microscopy, an alternative evaluation method may be used. Typically a representative sample of the diamond grains will be evaluated and the results for that sample will be assumed to apply to the same process batch of diamond grains. Because optical microscopy is not destructive, the evaluated diamond grains may be returned to the rest of the batch. This allows the entire batch to be evaluated as an alternative to using a representative sample. Typically, if an entire batch is evaluated, the optical microscopy process will be automated and image analysis software will be used to detect and catalog inclusion contaminants. Such software may also be used with representative sample methods to improve accuracy.

Although inclusion contaminants may be the easiest contaminants to detect via optical microscopy, contaminants on the outside of the diamond grains may also be detected.

Different light sources may be used to detect different contaminants or to allow detection in different color diamond grains. When different light sources are used with a human evaluator, filters may also be used to allow contaminants to be seen. Filters may also be used with software-based detection, but wider-spectrum detectors may also be used in place of filters.

Although articles, such as PCD may be evaluated by optical microscopy, some articles will be too opaque for optical microscopy.

Step 140 may also include non-optical microscopy, such as scanning electron microscopy (SEM), transmission electron microscopy (TEM), and scanning transmission electron microscopy (STEM). Although these forms of microscopy are useful in detecting contaminants, detecting may often be improved by combining them with Energy Dispersive X-ray Spectroscopy (EDS). EDS identifies particular elements in the microscope image, so it may also allow very specific identification of the type of contaminant. SEM, TEM, and STEM, alone or combined with EDS, provide little or no capability to detect contaminants beneath the surface. So, these methods may be combined with other evaluation methods to detect inclusion contaminants.

Sample preparation for non-optical microscopy tends to destroy articles and to render the sample unsuitable for later use. Accordingly, representative samples of diamond grains or PCD, similar to the representative samples described above for XRD and optical microscopy, may be used for non-optical microscopy evaluation.

Magnetic saturation may be evaluated in step 140 to determine whether many metal contaminants are present. Magnetic saturation is a property of certain metals, including many Group VIII metals, such as Co, Ni, Fe and their alloys. Magnetic saturation occurs when an increase in an external magnetic field applied to a material cannot increase the magnetization of the material further, so the total magnetic flux density of the material levels off. If diamond grains or PCD exhibit magnetic saturation, it indicates that a metal contaminant is still present. Methods to determine magnetic saturation are typically non-destructive, allowing testing of representative samples or entire batches of diamond grains or articles such as PCD.

Similarly, coercivity may be evaluated in step 140 to detect certain metals, particularly Group VIII metals, such as Co, Ni, and Fe. Coercivity is the intensity of the applied magnetic field required to reduce the magnetization of a material to zero after the magnetization of the material to saturation. Methods to determine coercivity are typically non-destructive, allowing testing of representative samples or entire batches of diamond grains or articles such as PCD.

The present disclosure provides an embodiment A relating to a method of purifying diamond by removing carbon contaminants from diamond grains in the diamond by a plasma cleaning process at a temperature at which metal inclusion contaminants in the diamond grains crack the diamond grains from within, and removing metal contaminants from the diamond in a chemical or electrochemical cleaning process.

The present disclosure provides an embodiment B relating to a method of purifying polycrystalline diamond (PCD) by removing carbon contaminants from diamond grains by a plasma cleaning process at a temperature at which metal inclusion contaminants in the diamond grains crack the diamond grains from within, removing metal contaminants from the PCD in a chemical or electrochemical cleaning process, and forming PCD from the purified diamond grains.

In addition, embodiments A, B and C may be used in conjunction with the following additional elements, which may also be combined with one another unless clearly mutually exclusive: i) the plasma cleaning process may be conducted in the absence of oxygen; ii) the plasma cleaning processes may include forming a plasma from hydrogen (H), argon, (Ar), oxygen (O), or fluorine (Fl) gas, or any combinations thereof; iii) the metal contaminants may include metal inclusion contaminants; iv) the metal contaminants may include Group VIII metal or an alloy or compound thereof; v) the plasma cleaning process temperature may be between 300° C. and 1500° C.; vi) the process may further include supplying microwave heating or induction heating during the plasma cleaning process; vii) the process may further include agitating the diamond grains during the plasma cleaning process; viii) the process may further include quenching the diamond grains after the plasma cleaning process; ix-) the chemical cleaning process may further include exposing the diamond grains to a liquid able to dissolve the metal contaminant; ix-1) the liquid may include hydrochloric acid, nitric acid, hydrofluoric acid, cupric chloride, and ferric chloride, or any combinations thereof; ix-2) the liquid may include sodium hydroxide, potassium hydroxide or a combination thereof; x) the electrochemical cleaning process may include placing the diamond in an anode in an electrochemical cell also comprising a cathode and an electrolyte and
applying a voltage to the electrochemical cell; xi) the process may include forming an article from the diamond grains after the plasma cleaning process and prior to the chemical or electrochemical cleaning process; xii) the process may include, after the chemical or electrochemical cleaning process, evaluating the diamond to determine if it contains less of a contaminant than a pre-selected amount of a pre-selected metal contaminant or carbon contaminant or a pre-selected set of contaminants comprising the metal contaminant or the carbon contaminant, and returning the diamond to the plasma purification process, the chemical or electrochemical cleaning process, or both if the diamond contains more contaminant than the pre-selected amount; xii-1) evaluating may include conducting x-ray diffraction (XRD) of the diamond; xii-2) evaluating may include conducting optical microscopy of the diamond; xii-3) evaluating may include conducting non-optical microscopy of the diamond; xii-4) evaluating may include testing magnetic saturation or coercivity of the diamond.

Although the present disclosure and its advantages have been described in detail, it should be understood that various changes, substitutions and alternations can be made herein without departing from the spirit and scope of the disclosure as defined by the following claims.

The invention claimed is:

1. A method of purifying diamond comprising:
removing carbon contaminants from diamond grains in the diamond and causing cracking of the diamond grains by a plasma cleaning process at a temperature at which metal inclusion contaminants in the diamond grains crack the diamond grains from within; and then
removing metal contaminants including the metal inclusion contaminants from the diamond in a chemical or electrochemical cleaning process.

2. The method of claim 1, comprising conducting the plasma cleaning in the absence of oxygen.

3. The method of claim 1, wherein the plasma cleaning processes comprises forming a plasma from hydrogen (H), argon, (Ar), oxygen (O), or fluorine (Fl) gas, or any combinations thereof.

4. The method of claim 1, wherein the metal contaminants comprise Group VIII metal or an alloy or compound thereof.

5. The method of claim 1, wherein the temperature is between 300° C. and 1500° C.

6. The method of claim 1, further comprising supplying microwave heating or induction heating during the plasma cleaning process.

7. The method of claim 1, further comprising agitating the diamond grains during the plasma cleaning process.

8. The method of claim 1, further comprising quenching the diamond grains after the plasma cleaning process.

9. The method of claim 1, wherein the chemical cleaning process comprises exposing the diamond grains to a liquid able to dissolve the metal contaminant.

10. The method of claim 9, wherein the liquid comprises hydrochloric acid, nitric acid, hydrofluoric acid, cupric chloride, and ferric chloride, or any combinations thereof.

11. The method of claim 9, wherein the liquid comprises sodium hydroxide, potassium hydroxide or a combination thereof.

12. The method of claim 1, wherein the electrochemical cleaning process comprises:
placing the diamond in an anode in an electrochemical cell also comprising a cathode and an electrolyte; and
applying a voltage to the electrochemical cell.

13. The method of claim 1, further comprising forming an article from the diamond grains after the plasma cleaning process and prior to the chemical or electrochemical cleaning process.

14. The method of claim 13, wherein the article comprises polycrystalline diamond (PCD).

15. The method of claim 1, further comprising, after the chemical or electrochemical cleaning process:
evaluating the diamond to determine if it contains the metal contaminants or the carbon contaminants, or both; and
returning the diamond to the plasma purification process, the chemical or electrochemical cleaning process, or both if the diamond contains the metal contaminants or the carbon contaminants, or both, in an amount removable by the method.

16. The method of claim 15, wherein evaluating comprises conducting x-ray diffraction (XRD) of the diamond.

17. The method of claim 15, wherein evaluating comprises conducting optical microscopy of the diamond.

18. The method of claim 15, wherein evaluating comprises conducting non-optical microscopy of the diamond.

19. The method of claim 15, wherein evaluating comprises testing magnetic saturation or coercivity of the diamond.

* * * * *